United States Patent
Morgan

(10) Patent No.: US 10,755,763 B2
(45) Date of Patent: Aug. 25, 2020

(54) APPARATUSES AND METHODS FOR DETECTION REFRESH STARVATION OF A MEMORY

(71) Applicant: MICRON TECHNOLOGY, INC., Boise, ID (US)

(72) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 16/259,052

(22) Filed: Jan. 28, 2019

(65) Prior Publication Data

US 2019/0172521 A1 Jun. 6, 2019

Related U.S. Application Data

(62) Division of application No. 15/603,063, filed on May 23, 2017, now Pat. No. 10,192,608.

(51) Int. Cl.
| | |
|---|---|
| *G11C 7/00* | (2006.01) |
| *G11C 11/406* | (2006.01) |
| *G11C 29/00* | (2006.01) |
| *G11C 29/02* | (2006.01) |
| *G11C 29/50* | (2006.01) |
| *G11C 11/4076* | (2006.01) |
| *G11C 11/408* | (2006.01) |

(52) U.S. Cl.
CPC .... *G11C 11/40615* (2013.01); *G11C 11/4076* (2013.01); *G11C 11/4087* (2013.01); *G11C 11/40603* (2013.01); *G11C 29/023* (2013.01); *G11C 29/028* (2013.01); *G11C 29/50016* (2013.01); *G11C 29/70* (2013.01)

(58) Field of Classification Search
CPC ...... G11C 2211/4065; G11C 11/40615; G11C 11/40618
See application file for complete search history.

(56) References Cited

U.S. PATENT DOCUMENTS

| | | | |
|---|---|---|---|
| 5,802,555 A * | 9/1998 | Shigeeda | G06F 1/1616 365/193 |
| 6,566,929 B2 * | 5/2003 | Pyo | G11C 7/06 327/296 |
| 6,754,126 B2 | 6/2004 | Yamaguchi et al. | |

(Continued)

FOREIGN PATENT DOCUMENTS

| | | |
|---|---|---|
| JP | 2015162253 A | 9/2015 |
| WO | 2018217582 A2 | 11/2018 |

OTHER PUBLICATIONS

PCT Application No. PCT/US18/33494, titled "Apparatuses and Methods for Detection Refresh Starvation of a Memory", filed May 18, 2018.

(Continued)

*Primary Examiner* — Tuan T Nguyen

(74) *Attorney, Agent, or Firm* — Dorsey & Whitney LLP

(57) ABSTRACT

Apparatuses and methods for detecting refresh starvation at a memory. An example apparatus, may include a plurality of memory cells, and a control circuit configured to monitor refresh request commands and to perform an action that prevents unauthorized access to data stored at the plurality of memory cells in response to detection that timing of the refresh request commands has failed to meet a refresh timing limit.

20 Claims, 14 Drawing Sheets

(56) References Cited

U.S. PATENT DOCUMENTS

| | | | |
|---|---|---|---|
| 7,203,115 B2 | 4/2007 | Eto et al. | |
| 7,529,146 B2* | 5/2009 | Moon | G11C 11/406 365/222 |
| 7,746,718 B2 | 6/2010 | Eguchi et al. | |
| 8,743,643 B2 | 6/2014 | Kim et al. | |
| 2005/0002254 A1 | 1/2005 | Otsuka et al. | |
| 2005/0280479 A1* | 12/2005 | Lin | G11C 8/18 331/185 |
| 2006/0294291 A1 | 12/2006 | Kinsley | |
| 2008/0151670 A1 | 6/2008 | Kawakubo et al. | |
| 2009/0106503 A1 | 4/2009 | Lee et al. | |
| 2009/0154279 A1* | 6/2009 | Hong | G11C 7/04 365/222 |
| 2009/0172267 A1* | 7/2009 | Oribe | G11C 16/3418 711/103 |
| 2009/0248972 A1 | 10/2009 | Perego et al. | |
| 2010/0162068 A1 | 6/2010 | Toda | |
| 2012/0014199 A1* | 1/2012 | Narui | G11C 11/406 365/222 |
| 2017/0117030 A1 | 4/2017 | Fisch et al. | |
| 2017/0352400 A1* | 12/2017 | Kim | G11C 29/783 |
| 2018/0342282 A1 | 11/2018 | Morgan | |
| 2019/0295627 A1* | 9/2019 | Ishikawa | G11C 11/4076 |
| 2019/0333566 A1* | 10/2019 | Kim | G11C 11/40603 |

OTHER PUBLICATIONS

U.S. Appl. No. 15/281,818, entitled "Semiconductor Device", filed Sep. 30, 2016.
International Search Report and Written Opinion received for PCT Application No. PCT/US2018/033494 dated Nov. 13, 2018, pp. all.

* cited by examiner

APPARATUSES AND METHODS FOR DETECTION REFRESH STARVATION OF A MEMORY

CROSS REFERENCE TO RELATED APPLICATION(S)

This application is a divisional of pending U.S. patent application Ser. No. 15/603,063 filed May 23, 2017. The aforementioned application is incorporated herein by reference, in its entirety, for any purpose.

BACKGROUND

A dynamic random access memory (DRAM), which is a typical semiconductor memory device, stores information by charges accumulated in cell capacitors, and, therefore, the information is lost unless refresh operations are periodically carried out. Therefore, refresh commands indicating refresh operations are periodically issued from a control device, which controls a DRAM. The refresh commands are issued from the control device at a frequency that all the word lines are certainly refreshed one time in the period of 1 refresh cycle (for example, 64 msec). Refresh starvation may occur when a controller violates a specification or standard in supplying refresh commands, making data stored at the DRAM vulnerable to unauthorized access.

DETAILED DESCRIPTION OF PREFERRED EMBODIMENTS

Hereinafter, some embodiments of the present disclosure will be described in detail with reference to accompanying drawings.

Figure 1A:
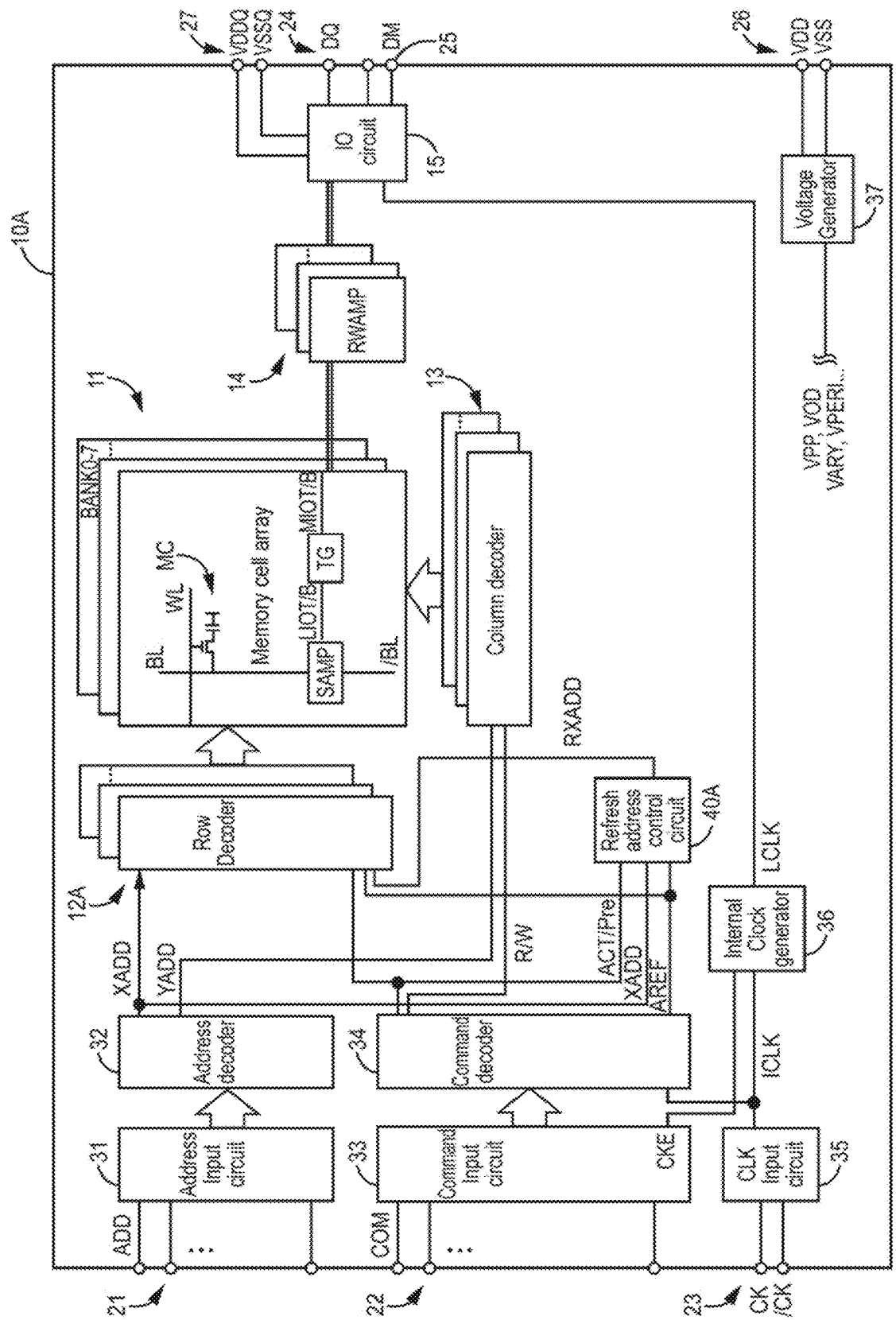
FIG. 1 is a block diagram showing an overall configuration of a semiconductor device according to an embodiment of the disclosure.
FIG. 1B is a block diagram showing a configuration of a row decoder according to an embodiment of the disclosure.

FIG. 1A is a block diagram showing an overall configuration of a semiconductor device 10A according to a first embodiment of the present disclosure.

The semiconductor device 10A according to the present embodiment is a synchronous DRAM (SDRAM) of, for example, a Double Data Rate 3 (DDR3) or Double Data Rate 4 (DDR4) type. The semiconductor device 10A may be integrated on a single semiconductor chip and has a memory cell array 11. The memory cell array 11 is provided with a plurality of word lines WL and a plurality of bit lines BL and has a configuration in which memory cells MC are disposed at the intersection points thereof. Selection of the word lines WL is carried out by a row decoder 12A, and selection of bit lines BL is carried out by a column decoder 13. The memory cell array 11, the row decoder 12A, the column decoder 13, and a read/write amplifier 14 are divided into eight banks BANK0 to BANK7.

Moreover, the semiconductor device 10A is provided with address terminals 21, command terminals 22, clock terminals 23, data terminals 24, data mask terminals 25, and power supply terminals 26 and 27 as external terminals.

The address terminals 21 are the terminals to which address signals ADD are input from outside. The address signals ADD are supplied to an address output circuit 32 via an address input circuit 31. The address decoder 32 supplies a row address XADD to the row decoder 12A and supplies a column address YADD to the column decoder 13. Moreover, the row address XADD is supplied also to a refresh address control circuit 40A.

The command terminals 22 are the terminals to which command signals COM are input from outside. The command signals COM are supplied to a command decoder 34 via a command input circuit 33. The command decoder 34 is a circuit which generates various internal commands by decoding the command signals COM. Examples of the internal commands include active signals ACT, pre-charge signals Pre, read/write signals R/W, and refresh signals AREF.

The active signal ACT is a pulse signal which is activated when the command signal COM is indicating row access (active command). When the active signal ACT is activated, the row decoder 12A of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 12A of the specified bank address and the word line WL specified by the row address XADD controlled thereby are deactivated.

The read/write signal R/W is a pulse signal which is activated when the command signal COM is indicating column access (read command or write command). When the read/write signal R/W is activated, the column decoder 13 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 24 to outside via a sense amplifier SAMP, a transfer gate TG, the read/write amplifier 14, and an input/output circuit 15.

On the other hand, if the active command and the write command are input, if the row address XADD and the column address YADD are input in synchronization with them, and, then, if write data DQ is input to the data terminal 24, the write data DQ is supplied to the memory cell array 11 via the input/output circuit 15, the read/write amplifier 14, the transfer gate TG, and the sense amplifier SAMP and is written to the memory cell MC specified by the row address XADD and the column address YADD.

The refresh signal AREF is a pulse signal which is activated when the command signal COM is indicating an auto-refresh command. Also, when the command signal COM is indicating a self-refresh entry command, the refresh signal AREF is activated once immediately after command input, thereafter, is cyclically activated at desired internal timing, and a refresh state is continued. By a self-refresh exit command thereafter, the activation of the refresh signal AREF is stopped and returns to an IDLE state. The refresh signal AREF is supplied to the refresh address control circuit 40A. The refresh address control circuit 40A supplies a refreshing row address RXADD to the row decoder 12A, thereby activating the predetermined word line WL contained in the memory cell array 11, thereby refreshing the information of the corresponding memory cell MC. Other than the refresh signal AREF, the active signal ACT, the row address XADD, etc. are supplied to the refresh address control circuit 40A. Details of the refresh address control circuit 40A will be described later.

External clock signals CK and /CK are input to the clock terminals 23. The external clock signals CK and the external clock signals /CK are mutually complementary signals, and both of them are supplied to the clock input circuit 35. The clock input, circuit 35 generates internal clock signals ICLK based on the external clock signals CK and /CK. The internal clock signals ICLK are supplied to the command decoder 34, an internal clock generator 36, etc. The internal clock generator 36 generates internal clock signals LCLK, which control the operation timing of the input/output circuit 15.

The data mask terminals 25 are the terminals to which data mask signals DM are input. When the data mask signal DM is activated, overwrite of corresponding data is prohibited.

The power supply terminals 26 are the terminals to which power supply potentials VDD and VSS are supplied. The power supply potentials VDD and VSS supplied to the power supply terminals 26 are supplied to a voltage generator 37. The voltage generator 37 generates various internal potentials VPP, VOD, VARY, VPERI, etc. based on the power supply potentials VDD and VSS. The internal potential VPP is the potential mainly used in the row decoder 12A, the internal potentials VOD and VARY are the potentials used in the sense amplifier SAMP in the memory cell array 11, and the internal potential. VPERI is the potential used in many other circuit blocks.

The power supply terminals 27 are the terminals to which power supply potentials VDDQ and VSSQ are supplied. The power supply potentials VDDQ and VSSQ supplied to the power supply terminals 27 are supplied to the input/output circuit 15. The power supply potentials VDDQ and VSSQ are the same potentials as the power supply potentials VDD and VSS, respectively, which are supplied to the power supply terminals 26. However, the dedicated power supply potentials VDDQ and VSSQ are used for the input/output circuit 15 so that power supply noise generated by the input/output circuit 15 does not propagate to other circuit blocks.

Figure 1B:
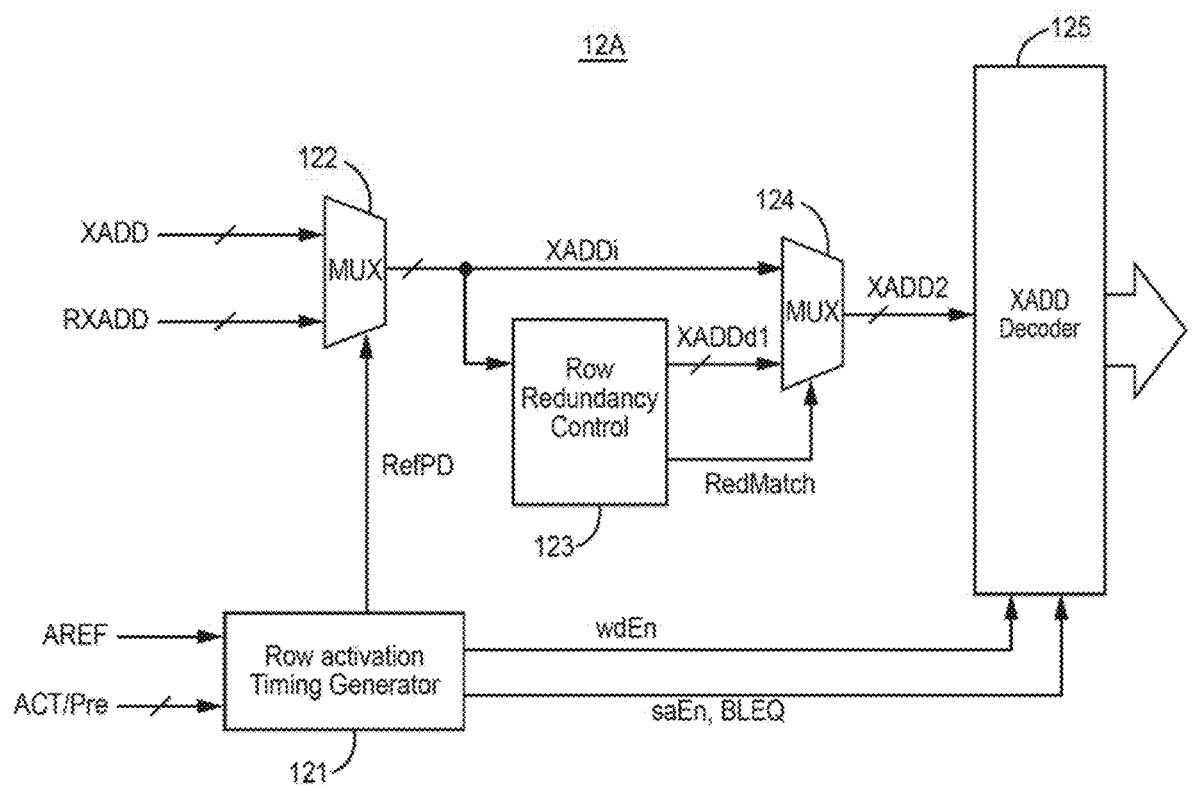

FIG. 1B is a block diagram showing a configuration of the row decoder 12A.

As shown in FIG. 1B, the row decoder 12A is provided with a row activation timing generator 121, which receives the refresh signal AREF, the active signal ACT, and the pre-charge signal Pre and generates a state signal RefPD, a word-line actuation signal wdEn, a sense-amplifier actuation signal saEn, and a bit-line equalize signal BLEQ. The state signal RefPD is supplied to a multiplexer 122, which selects one of the row address XADD and the refreshing row address RXADD. An address XADDi selected by the multiplexer 122 is supplied, to a row redundancy control circuit 123. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 124; wherein, if the hit signal RedMatch is not activated, the address XADDi is selected; and, if the control judge signal RedMatch is activated, the address XADDd1 is selected. The selected address XADD2 is supplied to an X address decoder 125. The X address decoder 125 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

For the semiconductor device 10A of FIG. 1A, information retention characteristics of memory cells may be reduced due to interference from adjacent word lines or noise caused by repeated memory accesses, called a row hammer. In a row hammer scenario, a wordline is repeatedly accessed (activated and deactivated), causing memory cells along adjacent wordlines to leak their charges and interact electrically between themselves, possibly altering the contents of the corresponding memory cells. In some instances, row hammer attacks may be an intentional method used to compromise data stored at the semiconductor device 10A, allowing the attacker to retrieve confidential or security information. Row hammer detection and mitigation can be accomplished in a few different ways, including monitoring individual wordlines for repeated accesses or implementing a random probabilistic model that randomly captures a wordline access and refreshes the adjacent wordlines. If a row hammer is detected, one solution is to "steal" a normal refresh cycle. "Stealing" a refresh cycle may include, instead of performing a refresh on a next logical wordline to be refreshed in a routine or predetermined refresh pattern (e.g., a "normal" refresh), specific wordlines targeted by the row hammer attack (e.g., wordlines adjacent to the row being repeatedly accessed) are selected for a refresh cycle. Thus, a normal refresh is skipped, for a refresh cycle in order to perform a targed refresh on a row that may be a target of a row hammer (e.g., or based on some other criteria).

In a targeted row hammer attack, an attacker is attempting to make a memory fail in a predictable manner such that an unauthorized user gains access to data stored at a controlled location in memory allowing that data to be accessed without proper authorization, and a system may be compromised as a result. In addition to a row hammer, another way that retention characteristics can be compromised is to starve a memory of refreshes by limiting refresh commands to the semiconductor device 10A. This leads to lower charges in the memory cells, and may make the memory more vulnerable to a row hammer attack. Thus, the semiconductor device 10A may include internal circuitry to monitor memory refreshes and take action to prevent unauthorized access to data stored in the memory cells when timing of the refresh request commands have failed to meet a refresh timing limit or requirement (e.g., a refresh starve condition). In some examples, the refresh timing limit or requirement may be based on a specification limit or a standard limit, such as the DDR3 or DDR4 standard refresh timing limits. The action taken by the semiconductor device may include increasing a rate of "stealing" refresh cycles (e.g., increasing a steal rate). Increasing the steal rate may necessarily reduce refresh cycles available for performing normal refreshes, which may make other portions of memory more susceptible to data loss due to a lack of refresh. However, as previously described, a row hammer attack is intended to cause a memory to fail in a predictable manner by attacking a specific row, allowing an attacker to potentially access data without proper authorization. Increasing a refresh steal rate when a refresh starve condition is detected may mitigate or reduce a risk of the memory failing in the predictable manner intended by the row hammer attack. A trade off to the increase in a steal rate may include unpredictable data loss in other areas of memory. However, because the memory is being operated outside of specified design limits in terms of refresh frequency, data stored at the memory is no longer guaranteed, and an acceptable outcome to protecting against a security breach may include data loss. The unpredictable nature of the data loss in other parts of the memory may prevent an attacker from gleaning useful data. In response to detection of the refresh starve condition, in lieu of or in addition to increasing a refresh steal rate, other actions taken by the semiconductor device 10A may include turning off temperature controlled refresh (e.g., a mode that reduces refreshes when certain environmental conditions are met), intentionally erasing or overwriting data, ceasing all normal refreshes to let the memory cells lose charge (and therefore data), locking out access to the memory, or combinations thereof.

Figure 2A:
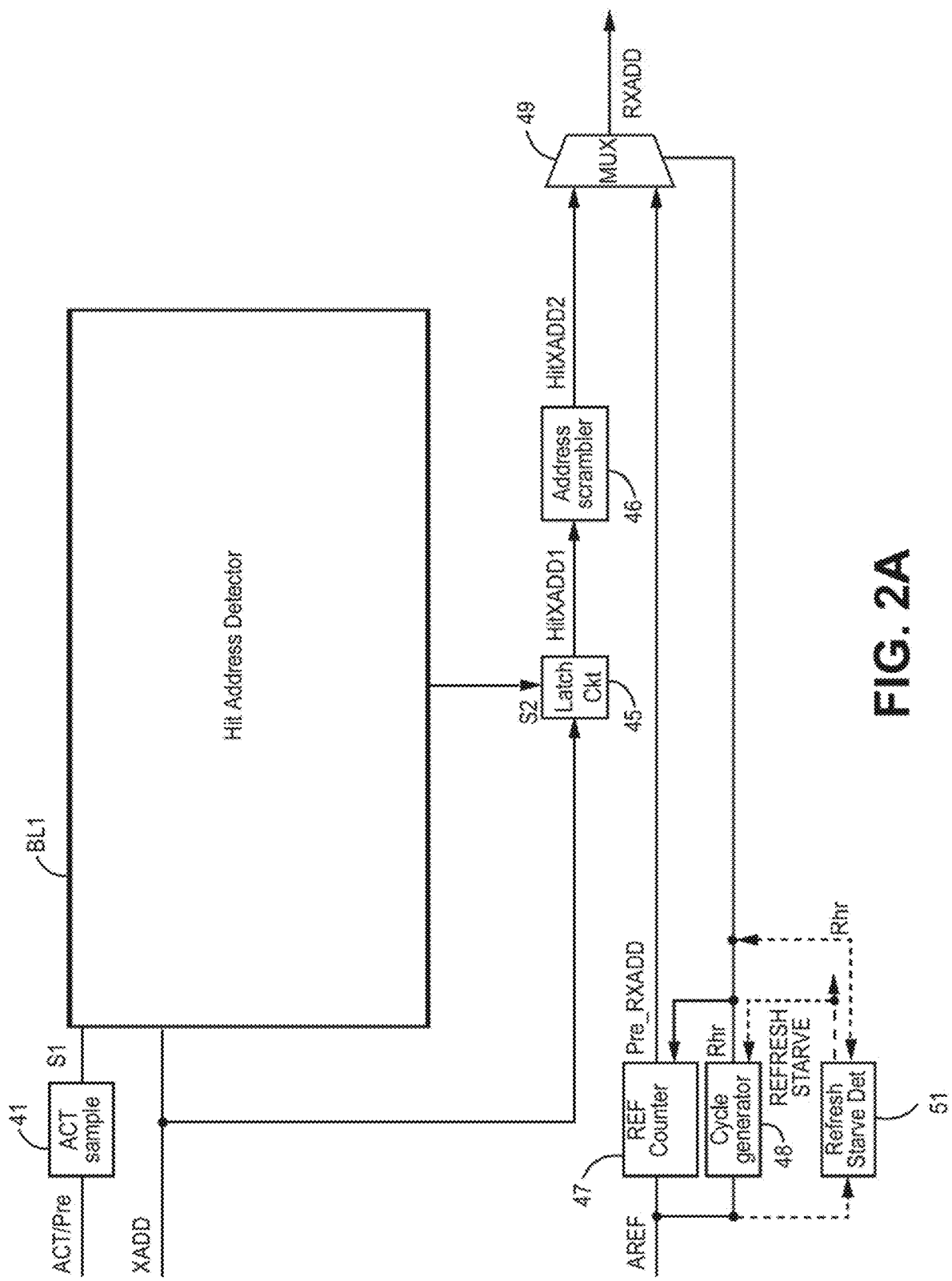
FIG. 2A is a block diagram showing a configuration of a refresh address control circuit according to an embodiment of the disclosure.

FIG. 2A is a block diagram showing a configuration of the refresh address control circuit 40A. The refresh address control circuit 40A may detect row hammers and/or may detect refresh command starvation, in some examples.

As shown in FIG. 2A, the refresh address control circuit 40A is provided with a sampling signal generator 41, which generates a sampling signal S1, which the BL1 may use to carry Out shift operations to provide the second sampling signal S2 to latch the current row address XADD at the latch 45 as the HitXAdd1 address.

The sampling signal generator 41 randomly samples the active signal ACT or the pre-charge signal Pre, which is generated in response to an active command or a pre-charge command, and outputs the signal as a first sampling signal S1. Meanwhile, the randomly sampled ACT or Pre signals may be configured to be sampled at a rate in which the reliability of Row Hammer refresh is the highest. This sample rate may depend on the appearance frequency of hammer addresses. In some examples, the sample rate may also depend on a number of stages (depth) of a shift register of the BL1 and that desired reliability is obtained.

The BL1 of FIG. 2A may provide a sampling signal S2 to latch a current row address XADD as a HitXAdd1 address that has a high probability being an unauthorized attack as part of a row hammer if a row hammer has occurred in the time between stealing refresh commands for RHR mitigation. The BL1 may use any number of algorithms to provide the S2 signal to latch the current row address XADD as the HitXAdd1 address, such as counting bits on a particular address, using random sampling, combinations thereof, etc. The latch circuit 45 latches the current row address XADD response to the second sampling signal S2 and outputs this to, an address scrambler 46 as a row address HitXADD1.

Therefore, the row address HitXADD1 output from the latch circuit 45 can be considered to be the row address XADD of the word line WL having a high access frequency. In terms of accesses, the higher the access frequency of the row address XADD of the word line WL, the higher the probability thereof of being latched by the latch circuit 45 in response to the S2 signal; therefore, the row address XADD of the word line WL which is accessed by an extremely high frequency that reduces the information retention characteristics of the memory cells MC connected to the adjacent word line WL is latched by the latch circuit 45 with an extremely high probability.

Based on the row address HitXADD1 output from the latch circuit 45, the address scrambler 46 converts that to a row address HitXADD2 of the word line WL affected by the highly-frequent access. In other words, if the row address HitXADD1 is an aggressor address, the row address HitXADD2 is a victim address. In many cases, the row address HitXADD2, which is the victim address, is the address of the word WL which is adjacent to the word line WL accessed by the row address HitXADD1, which is the aggressor address.

Figure 2B:
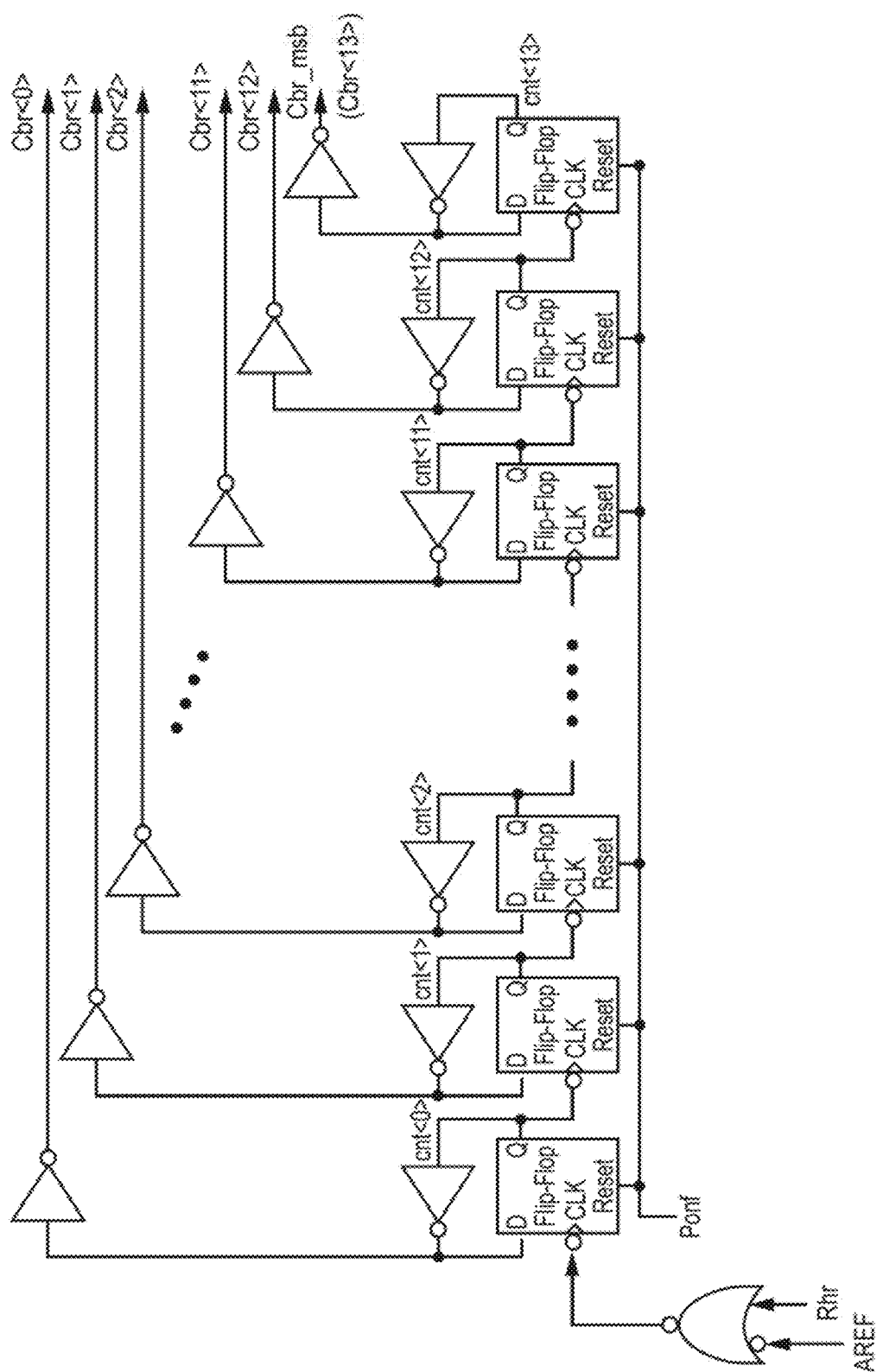
FIG. 2B is a block diagram showing a configuration of a refresh counter according to an embodiment of the disclosure.

As shown in FIG. 2A, the refresh address control circuit 40A further contains a refresh counter 47 and a refresh cycle generator 48. As shown in FIG. 2B, the refresh counter 47 is a circuit which updates a row address Pre_RXADD when the refresh signal AREF is activated. The row address Pre_RXADD is the address of the word line corresponding to the memory cell MC to be refreshed in response to the refresh signal AREF. However, if an interrupt cycle signal Rhr generated by the refresh cycle generator 48 is activated, update of the row address Pre_RXADD by the refresh counter 47 is prohibited even if the refresh signal AREF is activated.

Figure 2C:
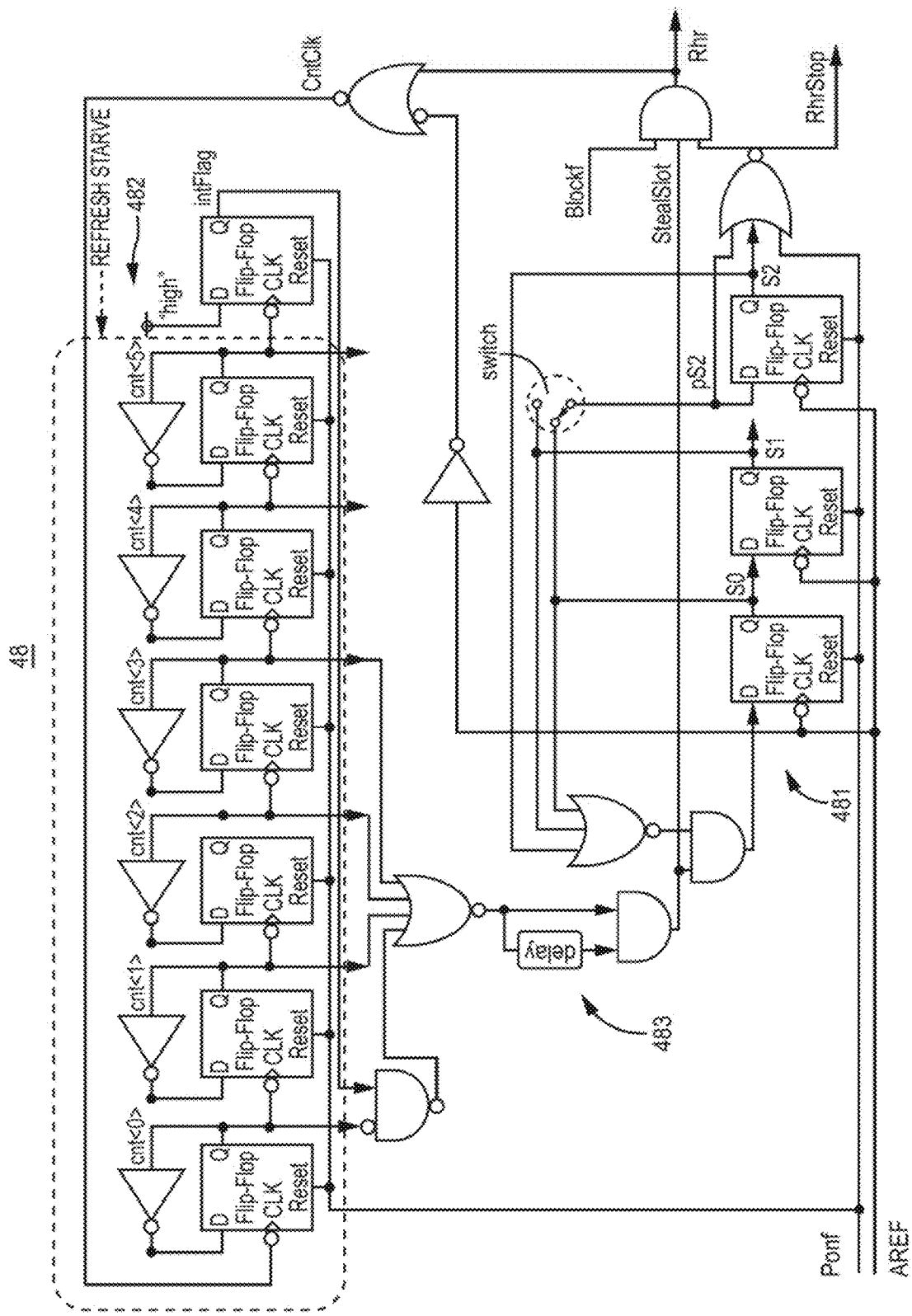
FIG. 2C is a block diagram showing a configuration according to art example of a refresh cycle generator according to an embodiment of the disclosure.
Figure 2D:
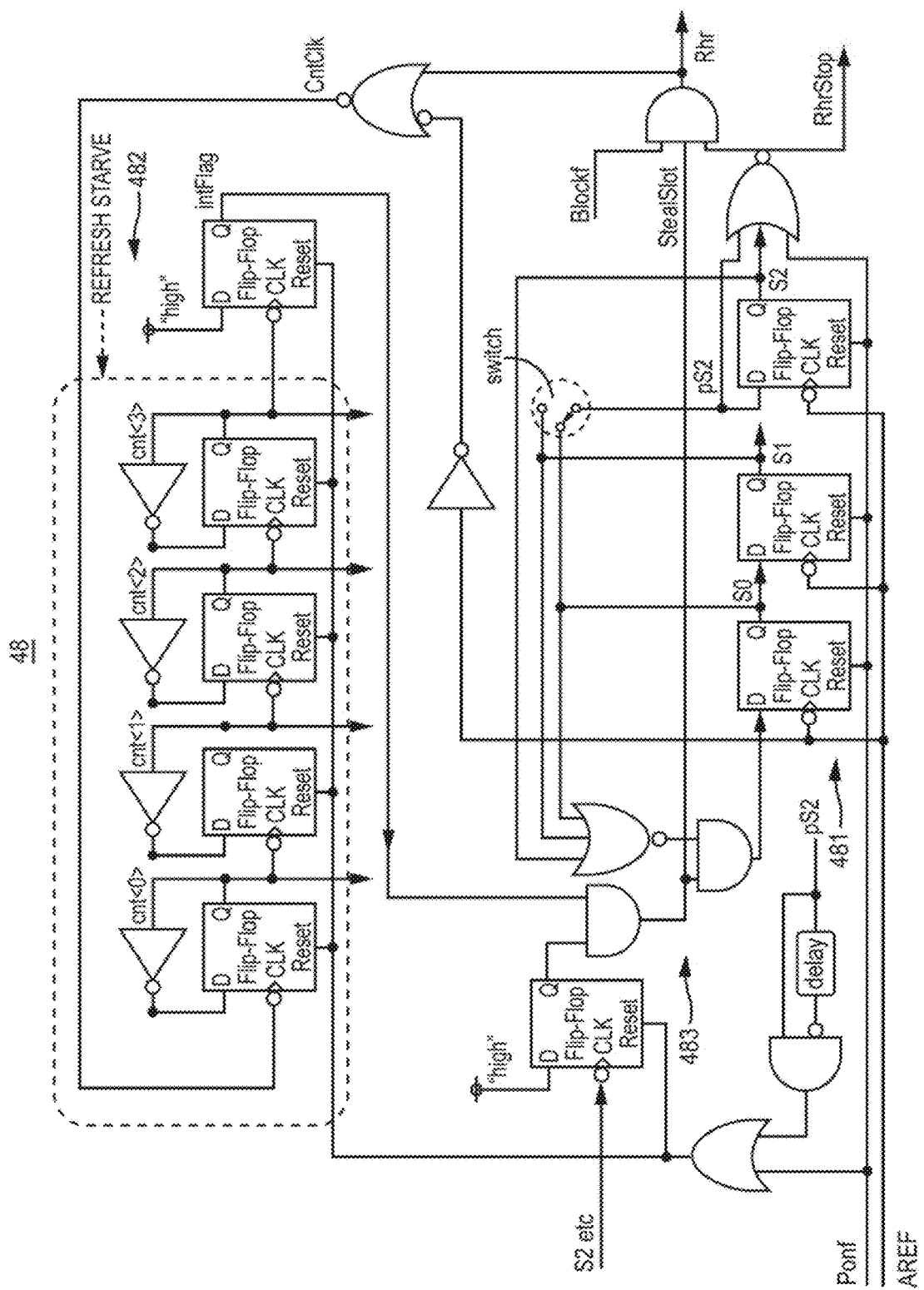
FIG. 2D is a block diagram showing a configuration according to another example of the refresh cycle generator according to an embodiment of the disclosure.

The refresh cycle generator 48 activates the interrupt cycle signal. Rhr in response to a predetermined times of activation of the refresh signal AREF. For example, as shown in FIG. 2C, the refresh cycle generator 48 is composed of a counter circuit 481, which uses the refresh signal AREF as a clock synchronization signal, a shift register 482, and a combination logic circuit 483. As a modification example, the refresh cycle generator 48 may be configured to be activated in response to the second sampling signal S2. For example, such a configuration for the refresh cycle generator 48 is shown in FIG. 2D. According to this, the frequency of later-described additional refresh operations can be reduced. The interrupt cycle signal Rhr is supplied to the refresh counter 47 and a multiplexer 49.

In one embodiment, the refresh starve detection circuit 51 receives the AREF signal indicating a refresh request and provides a refresh starve signal at an output. In some examples, the refresh starve signal may be provided to the refresh cycle counter 48. In other examples, the refresh starve signal may be provided to other circuitry of a semiconductor device, such as the semiconductor device 10A of FIG. 1A. The refresh starve signal may indicate a refresh starve condition. A refresh starve condition exists when the timing of refresh request commands received from a controller fail to meet a refresh timing limit or requirement. In some examples, the refresh timing limit or requirement may be set according to a specification or standard, such as DDR3 or DDR4. Failing to meet the refresh timing requirements may make rows targeted in a row hammer scenario more vulnerable to attack. When a refresh starve condition is detected, to mitigate unauthorized access to data, the semiconductor device 10A may take an action to prevent unauthorized access to data stored at the semiconductor device 10A. For example, the semiconductor device 10A may increase a steal rate for row hammer refreshes (RHR) (e.g., as shown by providing the REFRESH STARVE signal to the shift register 482 in FIGS. 2C and 2D), turn off the temperature compensated refreshes feature, intentionally erase or write over the stored data, cease all normal refreshes, or combinations thereof. The actions are intended to reduce a likelihood that the memory fails in predictable manner intended by a row hammer attack, and increase a likelihood that the memory tails in an unpredictable manner or in a manner chosen by the manufacturer.

In another embodiment, rather than monitoring refresh request commands, the refresh starve detection circuit 51 may monitor refresh steals via the Rhr signal indicating to determine when a refresh steal was last performed, and may provide the Rhr signal at an output. In this example, when the refresh starve detection circuit 51 detects that a time between refresh steals fails to meet a refresh timing requirement, the refresh starve detection circuit 51 may force a refresh steal via the Rhr signal.

The multiplexer 49 receives the row address HitXADD2 output from the address scrambler 46 and the row address Pre_RXADD output from the refresh counter 47 and outputs either one of them to the row decoder 12A as the row address RXADD of a refresh target. The selection thereof is carried out by the interrupt cycle signal Rhr; wherein, if the interrupt cycle signal Rhr is deactivated, the row address Pre_RXADD output from the refresh counter 47 is selected; and, if the interrupt cycle signal Rhr is activated, the row address HitXADD2 output from the address scrambler 46 is selected; thereby switching and carrying out a normal refresh and a Row Hammer refresh respectively.

Figure 3:
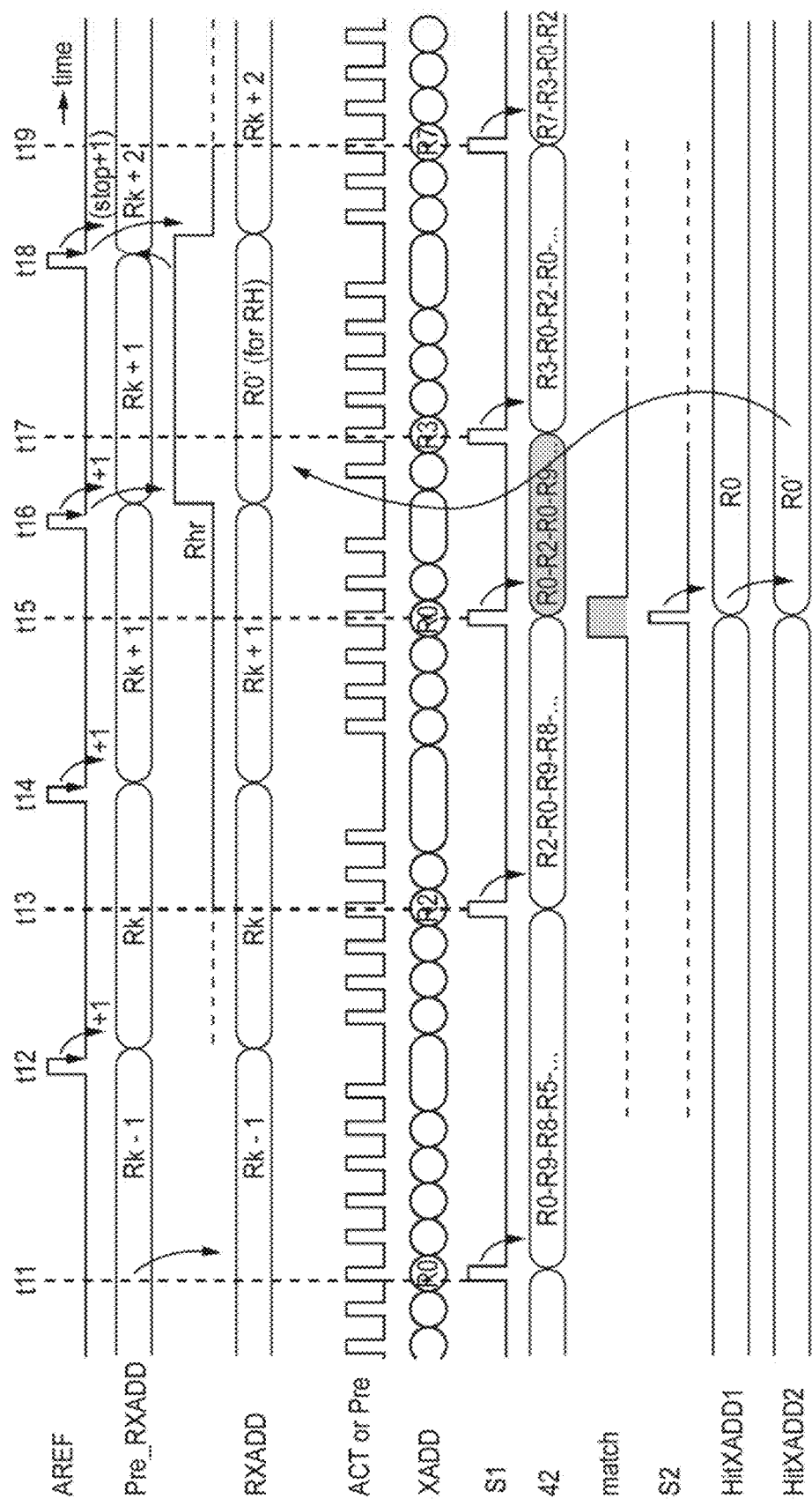
FIG. 3 is a timing chart for describing operations of the refresh address control circuit according to an embodiment of the disclosure.

FIG. 3 is a timing chart for describing the operations of the refresh address control circuit 40A in a specific embodiment.

In the example shown in FIG. 3, the refresh signal AREF is activated at time t12, t14, t16, and t18, and the first sampling signal S1 is activated at time t11, t13, t15, t17, and t19.

When the first sampling signal S1 is activated at the time t11, the value R0 of XADD input. In this case, since the second sampling signal S2 is not activated, when the refresh signal AREF is activated at the time 112, normal refresh is carried out. In this case, the count value of the refresh counter 47 is incremented from Rk−1 to Rk.

Similarly, when the first sampling signal S1 is activated at the time t13, the value R2 of XADD input at this timing is input to the BL1. Also in this case, since the second sampling signal S2 is not activated, when the refresh signal AREF is activated at the time t14, normal refresh is carried out. In this case, the count value of the refresh counter 47 is incremented from Rk to Rk+1.

Similarly, when the first sampling signal S1 is activated at the time t15, since the value R0 of XADD input at this timing had already been received, the second sampling signal S2 may be activated, in this example. Then, in response to the second sampling signal S2, the current row address R0 is latched by the latch circuit 45, and a row address R0' related to the row address R0 is output from the address scrambler 46.

At the time t16, the refresh signal AREF is activated, and Rk+2 is supplied from the refresh counter 47 as the row address Pre_RXADD. In this case, since the interrupt cycle signal Rhr is in an active state, instead of the row address Rk+2 which is output of the refresh counter 47, the row address R0' which is output of the address scrambler 46 is output from the multiplexer 49. As a result, the word line WL corresponding to the row address R0' is accessed, and a refresh operation is carried out. Moreover, since the interrupt cycle signal Rhr is activated, the update operation of the refresh counter 47 is stopped, and the count value thereof is fixed to Rk+1.

Then, when the first sampling signal S1 is activated at the time t17, the value R3 of XADD input at this timing is input to the shift register 42, and a shift operation is carried out. In this case, since the second sampling signal S2 is not activated, when the refresh signal AREF is activated at the time t18, normal refresh is carried out. In this case, the count value of the refresh counter 47 is incremented from Rk+1 to Rk+2.

In this manner, the access responding to the active signal ACT is intermittently monitored by using the first sampling signal S1; and, if occurrence of a predetermined times of access with respect to the same word line WL in a predetermined period of time is detected, the row address HitXADD1 of the word line WL is latched by the latch circuit 45. The row address HitXADD1 is converted to the row address HitXADD2 by the address scrambler 46 and, in response to activation of the interrupt cycle signal Rhr, is supplied to the row decoder 12A. As a result, the word line WL which is related to (mainly adjacent to) the word line WL' having a high access frequency is activated. Therefore, the memory cell MC, which may have critically decreased data retention characteristics, can be additionally refreshed.

Figure 4A:
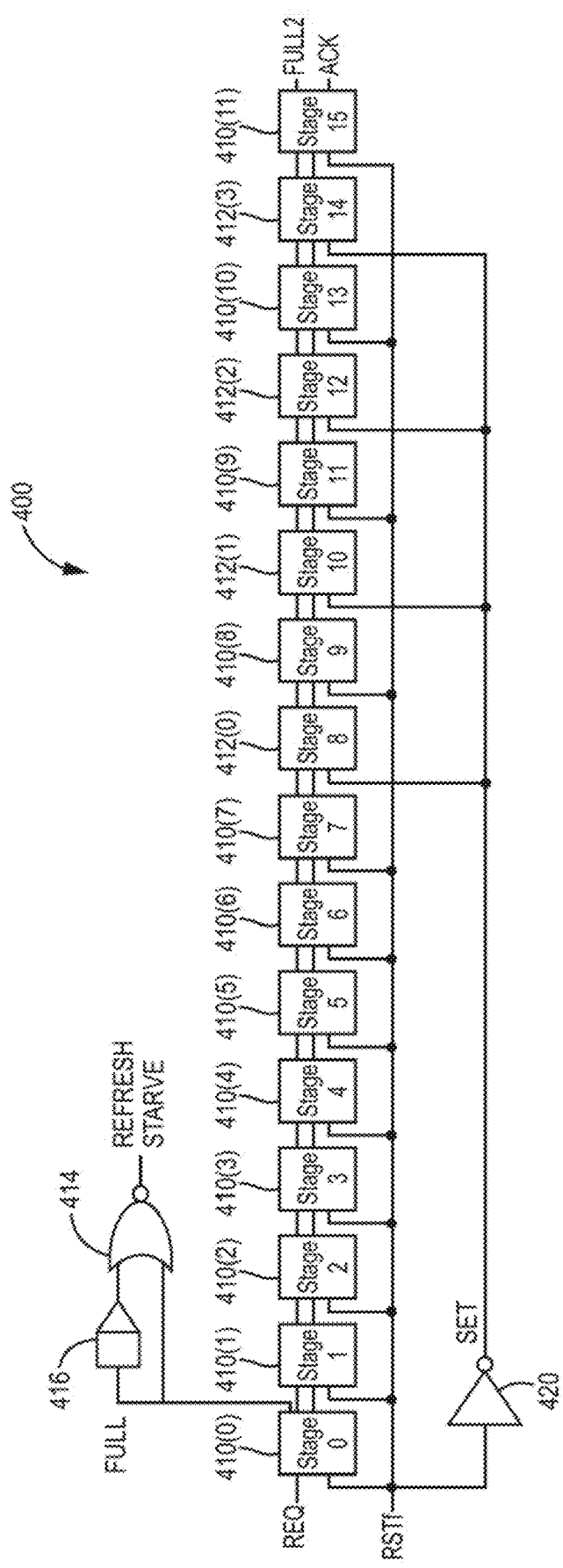
FIG. 4A is a block diagram showing a configuration of a refresh starve detection circuit in accordance with some embodiments of the disclosure.

FIG. 4A is a block diagram showing a configuration of a refresh starve detection circuit 400 in accordance with some embodiments of the disclosure. The refresh starve detection circuit 400 may be used in the refresh starve detection circuit 51 of FIG. 2A. The refresh starve detection circuit 400 monitors the timing of refresh request commands and provides an active refresh starve signal REFRESH STARVE when the refresh starve condition is met.

The refresh starve detection circuit 400 may include a series of serially-coupled stage circuits 0-15 410(0-11) and 412(0-3). The stage circuit 0 410(0) may receive an expected refresh request command (e.g., based on expiration of a timer) signal REQ and the stage circuit 15 410(11) may receive an acknowledge signal ACK indicating receipt of a refresh command. The ACK signal may be based on an AREF command received from the command decoder 34 of FIG. 1. The REQ signal may be set according to an expectation of received refresh commands. For example, in the DDR4 specification specifies a refresh command is expected every 7.8 μs. Therefore, the REQ signal may receive a pulse every 7.8 μs.

In operation, the stage circuits 0-15 410(0-11) and 412(0-3) may be initialized using the reset signal RSTf and set signal SET. The RSTf and SET signals may be fixed polarity signals driven by circuitry of the refresh starve detection circuit 400. The initialization may set the circuits such that the stage circuits 410(0-11) are initialized to a low logic level 0 and the stage circuits 412(0-3) are initialized to a high logic 1 level. Collectively, responsive to the ACK and REQ signals, the stage circuits 0-15 410(0-11) and 412(0-3) may operate similar to a shift register that is capable of shifting forward and backward (e.g., shifting to the left in response to a REQ signal and shifting to the right in response to the ACK signal. Thus, the RSTf and SET signals may be used to set a middle stage circuit 8 412(0) as a current stage. The SET signal may be an inverted. RSTf signal via the inverter 420. When everything is operating normally in accordance a specification, the stage circuit 15 410(11) may receive a pulse on the ACK signal at regular intervals (e.g., approximately 7.8 μs in DDR4) that correspond to receipt of refresh commands, causing the a current stage of the stage circuits 410(0-11) and 412(0-3) to shift (e.g., increment) one stage to the right, and the stage circuit 0 410(0) may receive a pulse on the REQ signal at the defined period intervals (e.g., based on expiration of a timer, for example corresponding to the 7.8 μs in DDR4), causing the current stage to shift (e.g., decrement) one stage to the left. In this scenario, the current stage may generally oscillate between stage circuit 7 410(7) and stage circuit 8 412(0) or between stage circuit 8 412(0) and stage circuit 9 410(8) when the refresh commands are received periodically as defined by a specification or standard. In some examples, the timer intervals may include some margin, such as less than 5%. In an example, the margin may be set to approximately 4%.

However, some specifications allow for "debits" and "credits" on refresh commands. For example, if a controller is busy with accessing the memory, it may delay sending refresh commands and have a refresh "debit" that is made up later. The DDR4 specification allows up to eight missed refresh command intervals before the specification is violated. Conversely, if the controller is idle and has time, it may send more frequent refresh commands in order to have a refresh "credit" in case the controller becomes busy later, and is unable send the refresh commands at the normal period intervals. The DDR4 specification allows for a credit of up to eight refresh commands. The 16 stage circuits 0-15 410(0-11) and 412(0-3) correspond to an embodiment that allows eight refresh debits before a refresh starve condition is detected and allows a maximum of eight refresh credits to be accounted for.

If a semiconductor device stops receiving refresh commands altogether, or consistently receives refresh commands at intervals, longer than the specified refresh interval period (e.g., 7.8 μs in DDR4), the number of debits may eventually exceed a specified count (e.g., exceed eight refresh debits), which may put the controller in violation of the specification or standard. This may be indicated via the FULL signal provided at an output of the stage circuit 0 410(0). That is, the FULL signal may indicate whether the semiconductor device is being starved of refreshes. For example, when active (e.g., set or a high logic level), the FULL signal may indicate that the timing of refresh request commands provided to the semiconductor device 10A has failed to meet an operating specification or standard. The FULL signal may be provided to a NOR gate 414 and to a delay gate 416. The delayed FULL signal may be provided to the NOR gate 414 and the NOR gate 414 may provide the refresh starve signal REFRESH STARVE at an output based on the full signal and the delayed full signal from the delay gate 416.

Conversely, when refresh commands are being received more frequently than expected, the FULL2 signal from the stage circuit 15 410(11) may indicate that the maximum number of refresh request credits has been reached, and no further refresh credits for refresh request commands are granted.

It will be appreciated that while FIG. 4A depicts 16 stage circuits 0-15 410(0-11) and 412(0-3), more or less stage circuits may be included. In some examples, a count of stage circuits may be dependent on a standard or specification for a refresh command operation.

Figure 4B:
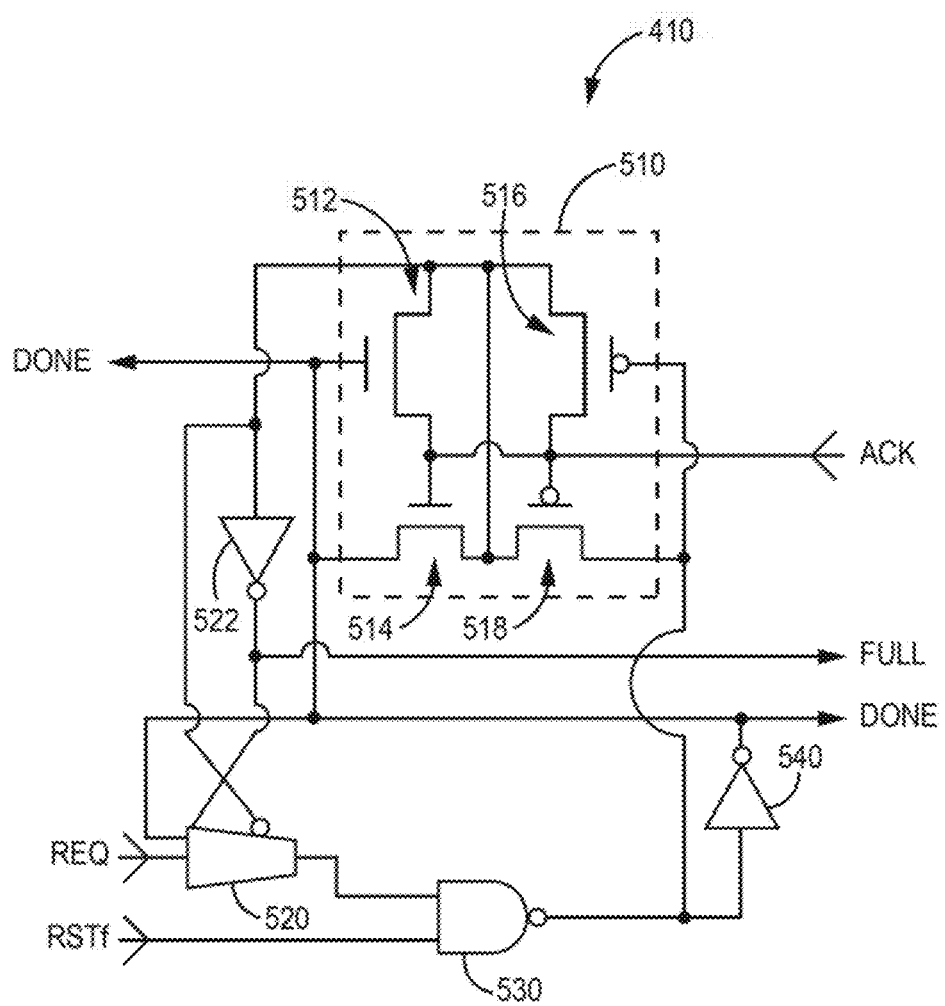
FIG. 4B is an example circuit diagram of a stage circuit in accordance with some embodiments of the disclosure.

FIG. 4B is an example circuit diagram of a stage circuit 410 in accordance with some embodiments of the disclosure. The stage circuit 410 may be used in any of the stage circuits 410(0-11) of FIG. 4A.

The stage circuit 410 may include an Exclusive NOR (XNOR) gate 510 to receive an acknowledge signal ACK together with the true and inverse of signal DONE and provide the inverse of the full signal FULL. XNOR gate 510 compares two inputs outputting a high logic level when they match and a low logic level when they are different. The stage circuit 410 may further include an inverter 522 to provide the FULL signal. The FULL signal in the stages circuits 410(1-10) may be unused. The ACK signal may correspond to receipt of a refresh command via the AREF signal. The XNOR gate 510 may include transistors 512, 514, 516, and 518. In some examples, the transistors 512 and 514 may be n-type transistors and the transistors 516 and 518 may be p-type transistors. The ACK signal may control the gates of the transistors 514 and 518 and the DONE signal may control the gates of the transistors 512 and 516 (e.g., complement of the DONE signal controls the transistor 516). It will be understood by those skilled in the art that while the transistor arrangement of XNOR gate 510 is advantageous due to low transistor count, another one of the multiple ways to achieve the XNOR function may be used in some examples due to another advantage such as speed or drive strength.

The stage circuit 410 further includes a pass gate 520 to pass through the REQ signal if DONE matches ACK or the DONE signal if DONE does not match ACK. The stage circuit 410 may further include a NAND gate 530 to receive an inverted reset signal RSTf and, the output of the pass gate 520, and may provide an output signal to the XNOR gate 510 and an inverter 540, which provides the DONE signal. NAND gate 530 with inverter 540 and pass gate 520 form a latch to hold the state of the DONE signal when stage circuit 410 is full as indicated by the FULL signal at a high logic level. The REQ signal may correspond to expiration of a refresh command timer.

In operation, the stage circuit 410 may be initialized in response to the RSTf signal. The initialization may set the DONE signal low via the inverter 540. The ACK input is received from the DONE output of the right adjacent stage circuit 410 or 412 and the FULL signal is driven to low logic level if ACK is low (i.e. matches local DONE signal) or to a high logic level if ACK is high (i.e. does not match local DONE signal). In this way a known state is forced when RSTf signal is low and the state of REQ has no effect. When RSTf signal is set high after initialization, if the FULL signal is high, the REQ signal will continue to have no effect until the ACK input signal changes. If the FULL signal is low then in response to receipt of the REQ signal, the FULL signal may toggle high. That is, the output of the NAND gate 530 may toggle low (based on the RSTf signal also being set high). In response to the output of the NAND gate 530 toggling low, the DONE signal may toggle high via the inverter 540. The DONE signal toggling high may no longer match the state of the ACK signal and may force the FULL signal to a high value via the XNOR gate 510 and inverter 522 causing the REQ input to again have no effect.

In response to receipt of a high logic value on the ACK signal, the value of the DONE signal and the ACK signal may match once again and the FULL signal may toggle low. That is, the XNOR gate 510 may toggle the input to the inverter 522 high, which may force the FULL signal to a low value. With the FULL signal low, the pass gate 520 may direct the REQ input to NAND gate 530. The DONE signal may toggle low in response to the REQ signal toggling low via the NAND gate 530 and inverter 540.

In the context of FIG. 4A, if the stage circuit 410 is any other than the stage circuit 410(0), the DONE signal provided as an output on the left-hand side may be coupled to an ACK signal input of an adjacent stage circuit. Further, if the stage circuit 410 is any other than the stage circuit 410(11), the DONE signal provided as art output on the right-hand side may be coupled to a REQ signal input of an adjacent stage. The FULL signal of the stage circuit 0 410(0) may be used, to provide the REFRESH STARVE signal.

Figure 4C:
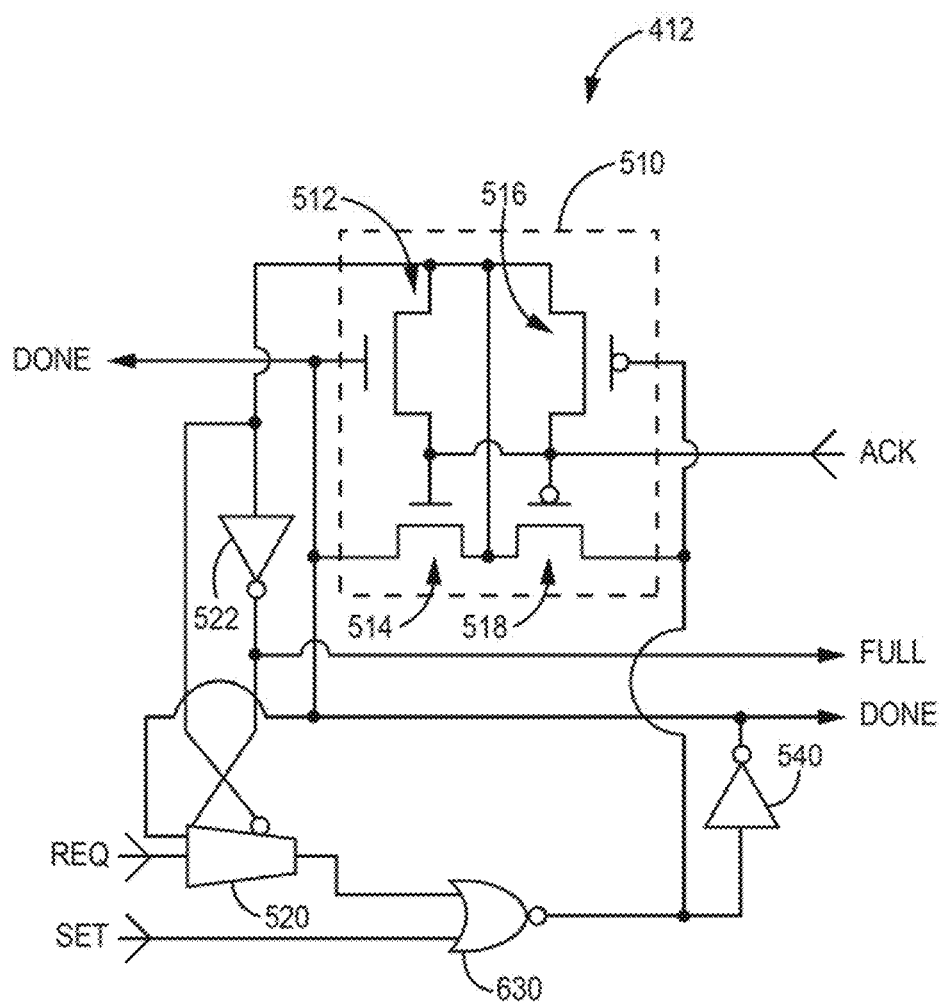
FIG. 4C is another example circuit diagram of a stage circuit it accordance with some embodiments of the disclosure.

FIG. 4C is an example circuit diagram of a stage circuit 412 in accordance with some embodiments of the disclosure. The stage circuit 412 may be used in any of the stage circuits 412(0-3) of FIG. 4A. The stage circuit 412 may include elements that have been previously described with respect to the stage circuit 410 of FIG. 4B. Those elements have been identified in FIG. 4C using the same reference numbers used in FIG. 4B and operation of the common elements is as previously described. Consequently, a detailed description of the operation of these particular elements will not be repeated in the interest of brevity.

A difference between the stage circuit 410 of FIG. 4B and the stage circuit 412 is the initialization circuitry. That is, rather than the NAND gate 530, the stage circuitry 412 includes a NOR gate 630 to receive the SET signal (e.g., a complement of the RSTf signal of FIGS. 4A and 4B).

In operation, the stage circuit 412 may be initialized in response to the SET signal. The initialization may set the DONE signal to a logical high value. In the context of FIGS. 4A and 4B, the initialization of the stage circuit 412 and the stage circuit 410 may have opposite polarities such that a middle stage of the refresh starve detection circuit 400 is set to a current stage. That is the stage circuits 410 and 412 located to the right of center are full and output a high logic level from each FULL output while the stage circuits 410 to the left of center are not full and output a low logic level from each FULL output. The NOR gate 630 may provide a low logic output in response to the SET signal, which may set the DONE signal high via the inverter 540 and the FULL signal to high when the ACK input is low. In this way a known state is forced when SET signal is high and the state of REQ has no effect. When SET signal is set low after initialization, if the FULL signal is high, the REQ signal will continue to have no effect until the ACK input signal changes. If the FULL signal is low then in response to receipt of the REQ signal, the FULL signal may toggle high. That is, the output of the NOR gate 630 may toggle high (based on the SET signal also being set low). In response to the output of the NOR gate 630 toggling high, the DONE signal may toggle low via the inverter 540. The DONE signal toggling low may no longer match the state of the ACK signal and may force the FULL signal to a high value via the XNOR gate 510 and inverter 522 causing, the REQ input to again have no effect.

In response to receipt of a low logic value on the ACK signal, the value of the DONE signal and the ACK signal may match once again and the FULL signal may toggle low. That is, the XNOR gate 510 may toggle in input to the inverter 522 high, which may force the FULL signal to a low value. With the FULL signal low, the pass gate 520 may direct the REQ input to NOR gate 630. The DONE signal may toggle high in response to the REQ signal toggling high via the NOR gate 630 and inverter 540.

In the context of FIG. 4A, the DONE signal provided as an output on the left-hand side may be coupled to an ACK signal input of an adjacent stage circuit and the DONE signal provided as an output on the right-band side may be coupled to a REQ signal input of an adjacent stage.

Figure 4D:
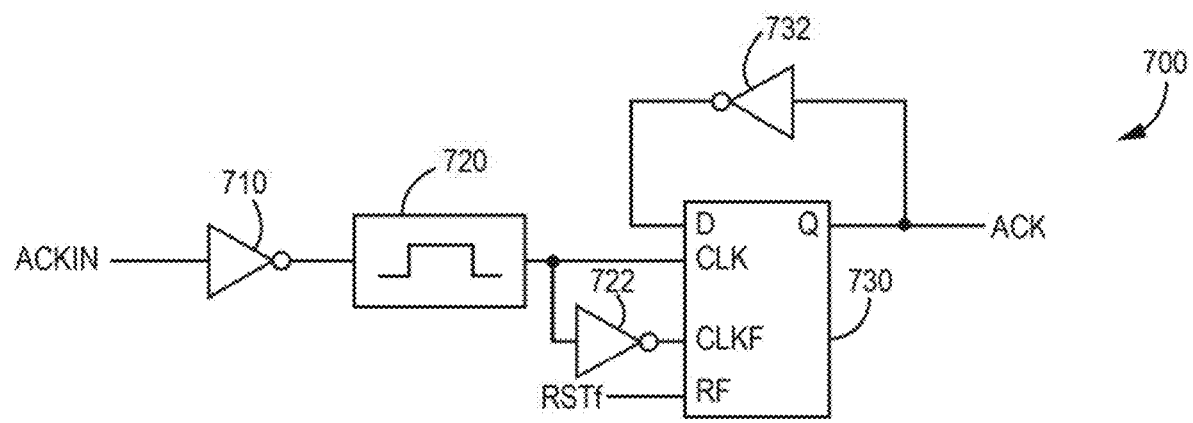
FIGS. 4D and 4E are block diagrams of example circuits to provide the REQ signal and the ACK signal in accordance of embodiments of the disclosure.
Figure 4E:
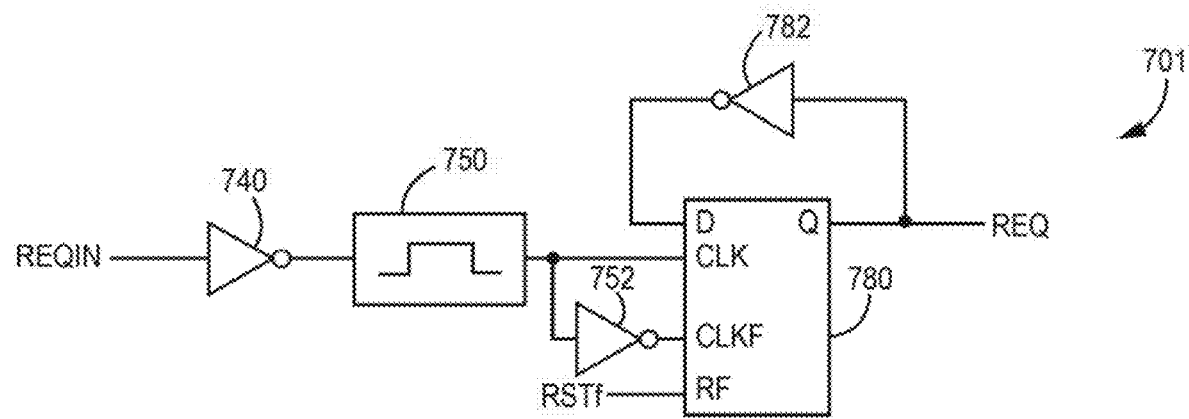

FIGS. 4D and 4E are example circuits 700 and 701 to provide the REQ signal to the stage circuit 410(0) and the ACK signal to the stage circuit 410(11) in accordance with embodiments of the disclosure. Referring to FIG. 4D, the circuit 700 includes inverters 710, 722, and 732, a pulse generator 720 and a flip-flop 730. The inverter 710 may invert an input ACK signal ACKIN and the pulse generator 720 may generate a pulse from the ACKIN signal to generate a clock signal. The ACKIN signal may correspond to receipt of a refresh command via the AREF signal. The clock signal (e.g., and an inverted clock signal via the inverter 722) may toggle the output of the flip-flop 730. That is, in response to the output of the pulse generator 720, the flip-flop 730 may propagate the input D to an output Q to toggle the ACK signal. The input D and the output Q are coupled together via an inverter 732.

Referring to FIG. 4E, the circuit 701 includes inverters 740, 752, and 782, a pulse generator 750 and a flip-flop 780. The inverter 740 may invert an input REQ signal REQIN and the pulse generator 750 may generate a pulse from the REQIN signal to generate a clock signal. The clock signal (e.g., and an inverted clock signal via the inverter 752) may toggle the output of the flip-flop 780. That is, in response to the output of the pulse generator 750, the flip-flop 780 may propagate the input D to an output Q to toggle the REQ signal. The input D and the output Q are coupled together via an inverter 782.

FIGS. 4A through 4E are presented and described as one example of a refresh starve detection circuit utilizing a certain asynchronous shift register to track the credit or debit status of refresh in a memory device. It will be understood by one skilled in the art that other asynchronous or synchronous shift registers may be substituted for the example shift register and the assignment of the direction of shift being right for a refresh command received and left for a time period elapsed may be otherwise assigned without departing from the scope of the present invention.

Figure 5A:
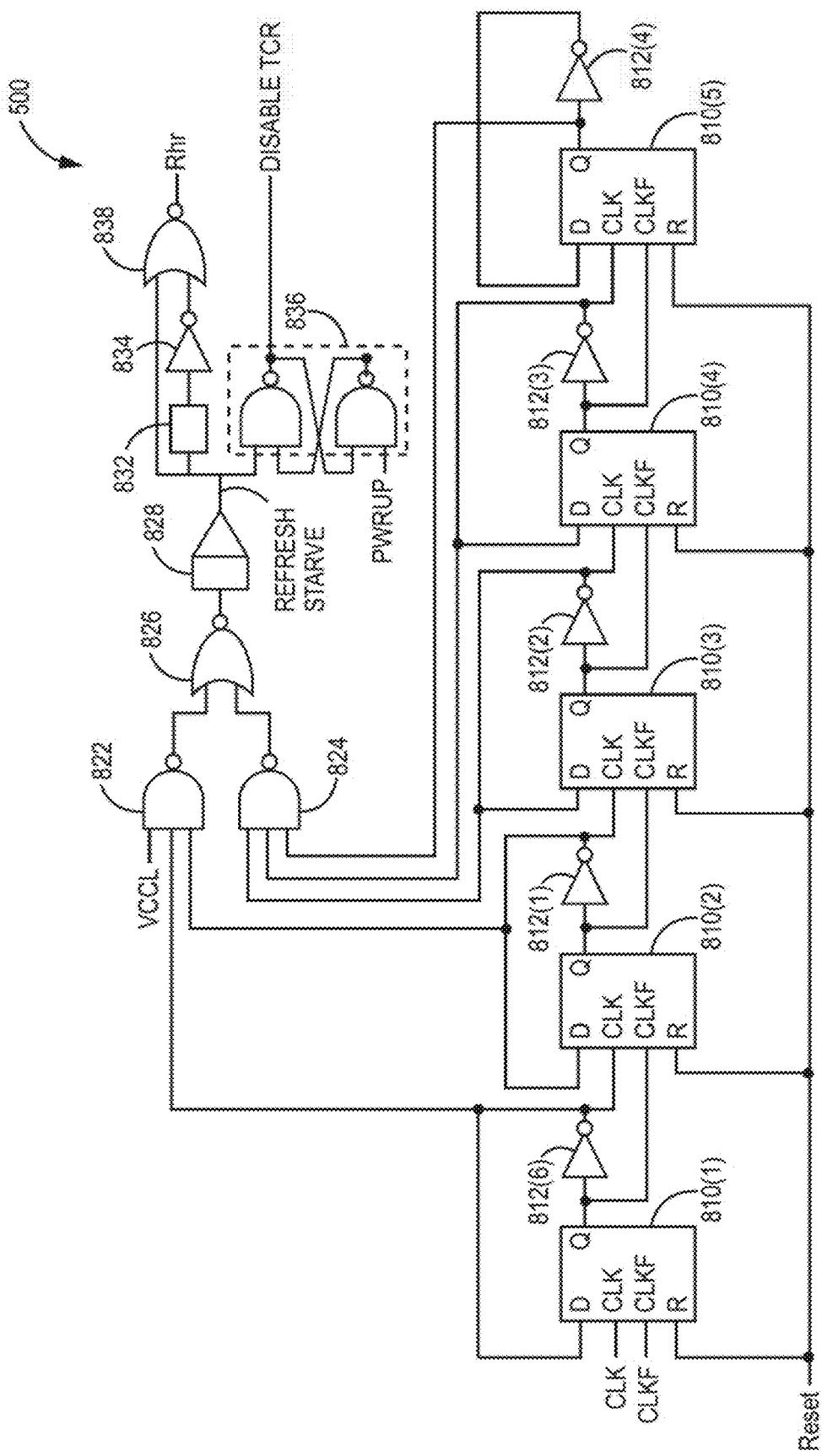
FIG. 5A is a block diagram showing a configuration of a refresh starve detection circuit according to a second embodiment of the present disclosure.
Figure 5B:
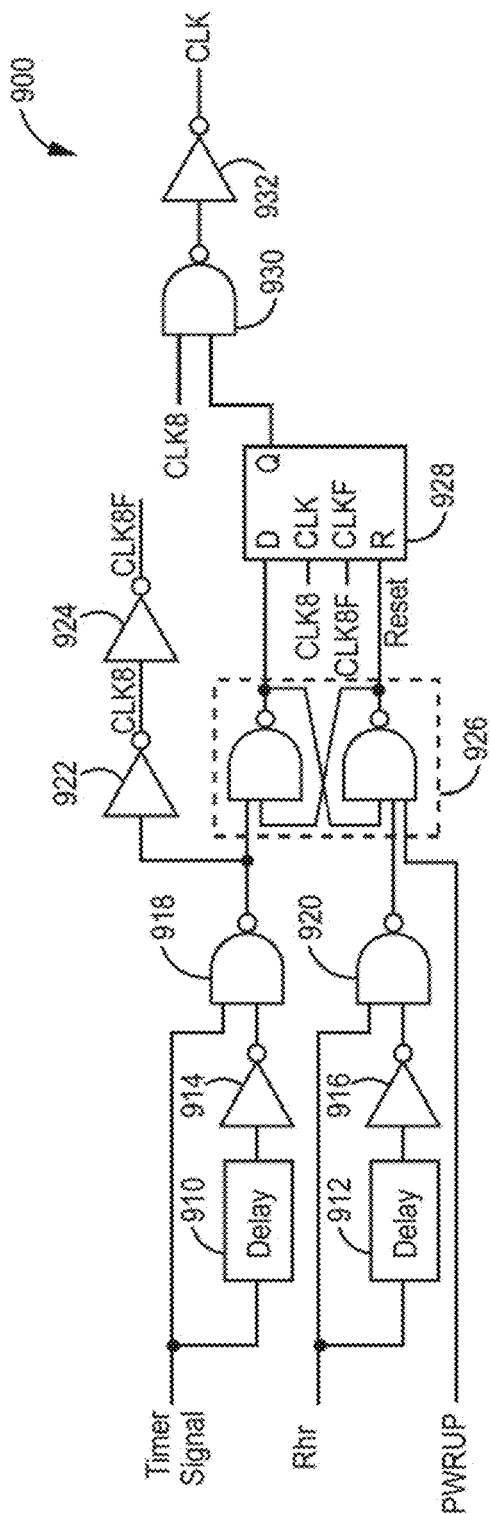
FIG. 5B is a block diagram of an example circuit to provide the CLK signal in accordance of embodiments of the disclosure.

FIG. 5A is a block diagram showing a configuration of a refresh starve detection circuit 500 in accordance with some embodiments of the disclosure. FIG. 5B is a block diagram showing a circuitry 900 to generate the CLK signal provided to the refresh starve detection circuit 500 of FIG. 5A in accordance with some embodiments of the disclosure. The refresh starve detection circuit 500 and the circuitry 900 may be used in the refresh starve detection circuit 51 of FIG. 2A. The refresh starve circuit 500 and the circuity 900 may detect timing of refresh steals via the RHR STEAL signal and may force a refresh steal (e.g., or take some other action as described with reference to FIG. 2A) in response to detecting that the timing of the refresh steals has failed to a meet a refresh steal limit.

The refresh starve detection 500 may include a series of serially-coupled flip-flops 810(1-5) and logic to perform a row hammer steal if no steal is detected in a defined time period (e.g., a NAND gate 822, NAND gate 824, NOR gate 826, buffer 828, delay 832, inverter 834, latch 836, and NOR gate 838). In some examples, the defined time period may be based on an expected steal of a refresh command for a row hammer receipt time period according to a specification or standard. For example, in DDR4, the expected steal time frequency is once every 8 refresh cycles, and may allow for up to 8 credits for a refresh command. Therefore, the timer may be set to one period longer than an expected stolen refresh frequency plus the number of allowed credits, or 17 refresh cycles. In some examples, the tinier may be set between 130 and 140 μs. In a specific example, the timer may be set to 132.6 or 136.8 μs.

In operation, the flip-flop 810(1) may receive a clock signal CLK (and an inverted clock signal CLKF) and may provide the input D to the output Q in response to the CLK signal. The CLK signal may be based on a lapse in refresh steals that fails to meet a refresh steal time limit. The output Q from the flip-flop 810(1) may be coupled to the CLK signal input of the flip-flop 810(2) via an inverter 812(1). The toggle of the output Q from the flip-flop 810(1) (e.g., in response to the CLK signal) may cause the flip-flop 810(2) to provide the input D to the output Q. The propagation of the output Qs from the remaining flip-flops 810(2) to the CLK signal inputs of a subsequent flip-flop continues to the flip-flop 810(5) (e.g., via the inverters 812(1-4), respectively). The inverted output signals from the flip-flops 810 (1-2) may be provided to the NAND gate 822 and the inverted output signals from the flip flops 810(3-4) and the output signal from the flop-flop 810(5) may be provided to the NAND gate 824. The output of the NAND gate 822 and the NAND gate 824 may be provided to inputs of the NOR gate 826. The NOR gate 826 may provide a logical high value when all of the inputs of the NAND gate 822 and the NAND gate 824 are logically high values, indicating, that a predetermined amount of time has elapsed since the last steal. The output of the NOR gate 826 may be delayed via the buffer 828. The buffer 828 may provide an output to an NOR gate 838 and to a latch 836. The NOR gate 838 may receive the output of the buffer 828 directly, and may receive a delayed version via a delay 832 and an inverter 834. The combination of the delay 832, inverter 834, and NOR gate 838 may provide a pulse on the Rhr signal. The pulse on the Rhr signal will cause the next one or more refreshes to be stolen for Row Hammer Repair and in addition will reset latch 926 on FIG. 5B thereby asserting the Reset signal high and resetting flip-flop 928 on FIG. 5B and flip-flops 810(1-5) on FIG. 5A in preparation to monitor refresh status for any subsequent refresh starve condition. The latch 836 may provide a disable temperature controlled refresh (TCR) mode signal that may be used to disable the TCR mode. The output of the latch 836 may be reset by a power up signal PWRUP.

FIG. 5B is a block diagram showing a circuitry 900 to generate the CLK signal provided at the input of the flip-flop NOR gate 510(0) of FIG. 5A. The circuitry 900 may include two logic paths to that control a 926, and a 928 to designate when the CLK signal is toggled. The first logic path includes a delay 910, an inverter 914, and a NAND gate 918. The delay 910 may receive a timer signal and may delay the timer signal prior to providing the timer signal to the NAND gate 918 via the inverter 914. The timer signal may be based on an expected refresh steal frequency. The NAND gate 918 may also receive the timer signal directly at a second input, and may pulse the output low when both inputs are high.

The second logic path includes a delay 912, an inverter 916, and a NAND gate 920. The delay 912 may receive a row hammer steal signal RHR STEAL and may delay the Rhr signal prior to providing; the Rhr signal to the NAND gate 920 via the inverter 916. The NAND gate 920 may also receive the Rhr signal directly at a second input, and may pulse the output low when both inputs are high. The Rhr signal may correspond to the Rhr signal of FIG. 2A.

The 926 may receive the outputs of both of the NAND gate 918 and the NAND gate 920 and may operate based on toggling of those two inputs. For example, if the timer signal controls the output of the latch 926, the Rhr signal has not toggled since the last timer signal. If the Rhr signal controls the output of the latch 926, then a refresh steal has occurred. The output of the latch 926 may be provided to the input and the reset of the flip-flop 928. The flip-flop 928 may be clocked by the delayed clock signal CLK8 and an inverted CLK8 signal CLK8F. The CLK8 signal may be an inverted output of the NAND gate 918 (via the inverter 922), the CLK8 signal may be inverted via the inverter 924 to provide the CLK8F signal. The output of the flip-flop 928 may be provided to a NAND gate 930 along with the CLK8 signal, and the NAND gate 930 may provide the CLK signal via the inverter 932 based on the output of the 928 and the CLK8 signal.

Figure 6:
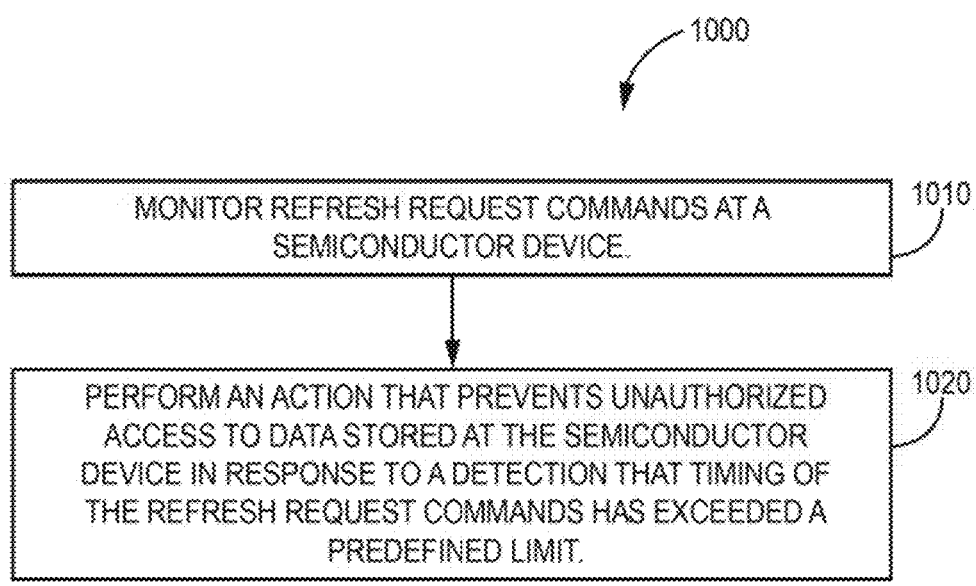
FIG. 6 is a flowchart of an example method for detecting refresh starvation at a memory according to an embodiment of the disclosure.

FIG. 6 is a flowchart of an example method 1000 for detecting refresh starvation at a memory according to an embodiment of the disclosure. The method 1000 may be performed using the semiconductor device 10A of FIG. 1, the refresh address control circuit 40A of FIG. 2A, the refresh starve detection circuit 400 of FIG. 4A, the stage circuit 410 of FIG. 4B, the stage circuit of FIG. 4C, the refresh starve detection circuit 800 of FIG. 5A, the circuitry 900 of FIG. 5B, or combinations thereof.

The method 1000 may include monitoring refresh request commands received from a controller at a semiconductor device, at 1010. Monitoring refresh request commands may include decrementing a current stage circuit of a plurality of stage circuits to a previous stage circuit in response to receipt of a request signal that indicates a time interval between expected refresh request commands has been exceeded, and incrementing the current stage circuit of a plurality of stage circuits to a subsequent stage circuit in response to receipt of an acknowledge signal that indicates a receipt of a refresh request command. The method 1000 may further include detecting that the timing of the refresh request commands has failed to meet a refresh time limit in response to lack of receipt of refresh request commands for a predefined time limit. The method 1000 may further include providing an indication that the timing of the refresh request, commands has failed to meet the refresh time limit when the current stage circuit is a first stage circuit of the plurality of stage circuits.

The method 1000 may further include performing an action that prevents unauthorized access to data stored at the semiconductor device in response to detection that timing of the refresh request commands has failed to meet a refresh time limit, at 1020. Performing the action that prevents unauthorized access to data stored at the semiconductor device may include causing a row hammer refresh steal rate to increase, causing a temperature controlled refresh mode that adjusts a refresh rate based on certain environmental conditions to be disabled, skipping refreshes, overwriting data stored at the semiconductor device, locking out access to the memory device or memory cells, or combinations thereof.

What is claimed is:

1. An apparatus comprising
   a refresh control circuit configured to perform a first refresh operation responsive to a first signal when a control signal is disabled and a second refresh operation responsive to a second signal when the control signal is enabled, the first signal being produced by a refresh counter and the second signal being not produced by the refresh counter;

a refresh starve detection circuit configured to:
receive refresh signals in series, each of the refresh signals being generated responsive to a refresh command;
enable the control signal when none of the refresh signals have been received during a predetermined period of time defined by a first one of the refresh signals and a second one of the refresh signals consecutively following the first one of the refresh signals.

2. The apparatus of claim 1, wherein the refresh starve detection circuit is further configured to receive timer signals generated in series at first intervals and measure the predetermined period of time by counting number of the timer signals.

3. The apparatus of claim 2, wherein the refresh starve detection circuit includes an up-down counter circuit performing one of count-up and count-down operations responsive to each of the timer signals and the other of count-up and count-down operations responsive to each of the refresh signals; and
wherein the control signal is enabled when value stored in the up-down counter circuit takes first value.

4. The apparatus of claim 2, wherein the refresh starve detection circuit comprises:
a counter circuit configured to be counted up responsive to a clock signal; and
a clock generator including, a latch circuit configured to be in a set state responsive to each of the timer signals and in a reset state responsive to each of the refresh signals, the clock signal is generated responsive to the timer signals when the latch circuit is in the set state and not generated irrespective of the timer signals when the latch circuit is in the reset state;
wherein the control signal is enabled when a value stored in the counter circuit takes first value.

5. An apparatus comprising:
a refresh control circuit configured to perform a first refresh operation based on a refresh counter value when a control signal is enabled; and
a refresh starve detection circuit configured to enable the control signal when a time period between consecutive refresh signals exceeds a refresh timing limit.

6. The apparatus of claim 5, wherein the refresh starve detection circuit is further configured to receive refresh signals generated responsive to a refresh command.

7. The apparatus of claim 5, wherein the refresh control circuit is further configured to perform a second refresh operation when the control signal is disabled.

8. The apparatus of claim 7, wherein the refresh starve detection circuit is further configured to disable the control signal when the time period between consecutive refresh signals is less than the refresh timing limit.

9. The apparatus of claim 8, wherein the refresh starve detection circuit is further configured to receive pulses on a timer signal at a defined interval and measure the time period between consecutive refresh signals by counting a number of pulses on the timer signal.

10. The apparatus of claim 9, wherein the refresh starve detection circuit includes an up-down counter circuit configured to perform count-up operations responsive to pulses on the timer signals, wherein the refresh starve detection circuit is configured to enable the control signal in response to the up-down counter circuit having a full value.

11. The apparatus of claim 10, wherein the up-down counter circuit is further configured to perform count-down operations responsive receipt of the refresh signals.

12. The apparatus of claim 9, wherein the refresh starve detection circuit comprises:
a clock signal generator configured to generate a clock signal responsive to the pulses on the timer signal; and
a counter circuit configured to increment responsive to the clock signal, wherein the refresh starve detection circuit is configured to enable the control signal in response to the counter circuit having a full value.

13. The apparatus of claim 12, wherein the refresh starve detection circuit further comprises a latch circuit configured to transition to a set state responsive to each of the pulses on the timer signal and transition to a reset state responsive to each of the refresh signals, wherein the clock signal generator is configured to generate the clock signal responsive to the pulses on the timer signal when the latch circuit is in the set state and to disable the clock signal when the latch circuit is in the reset state.

14. A method comprising:
determining whether a time period between consecutive refresh signals exceeds a refresh timing limit; and
in response to a determination that the time period between consecutive refresh signals exceeds the refresh timing, limit, performing, a first refresh operation based on a refresh counter value.

15. The method of claim 14, further comprising receiving refresh signals generated responsive to a refresh command.

16. The method of claim 14, further comprising performing a second refresh operation in response to a determination that the time period between consecutive refresh signals is less than the refresh timing limit.

17. The method of claim 16, wherein determining whether the time period between consecutive refresh signals exceeds the refresh timing limit comprises:
receiving pulses on a timer signal at a defined interval; and
measuring the time period between consecutive refresh signals by counting a number of pulses on the timer signal.

18. The method of claim 17, wherein counting the number of pulses on the timer signals comprises:
incrementing an up-down counter circuit in response to receipt of a pulse on the timer signal; and
decrementing the up-down counter circuit in response to receipt of the refresh signals, wherein the determination whether the time period between consecutive refresh signals exceeds the refresh timing limit is based on whether the up-down counter circuit is full.

19. The method of claim 17, further comprising:
generating a clock signal responsive to the pulses on the timer signal; and
incrementing a counter circuit responsive to the clock signal, wherein the determination whether the time period between consecutive refresh signals exceeds the refresh timing limit is based on whether the counter circuit has a full value.

20. The method of claim 19, further comprising:
setting a latch circuit to a set state responsive to each of the pulses on the timer signal, wherein generation of the clock signal responsive to the pulses on the timer signal is in response to the latch circuit being in the set state;
transitioning the latch circuit to a reset state responsive to each of the refresh signals; and
disabling disable the clock signal when the latch circuit is in the reset state.

* * * * *